(12) United States Patent
Koike et al.

(10) Patent No.: US 9,915,710 B2
(45) Date of Patent: Mar. 13, 2018

(54) MAGNETIC SENSOR, METHOD OF MANUFACTURING MAGNETIC SENSOR, AND METHOD OF DESIGNING MAGNETIC SENSOR

(71) Applicant: ALPS ELECTRIC CO., LTD., Ota-ku, Tokyo (JP)

(72) Inventors: Fumihito Koike, Tokyo (JP); Hirofumi Okumura, Tokyo (JP); Eiji Shinohara, Tokyo (JP); Kazuhiro Shigeta, Tokyo (JP); Taku Saito, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 88 days.

(21) Appl. No.: 15/088,185

(22) Filed: Apr. 1, 2016

(65) Prior Publication Data
US 2016/0313411 A1 Oct. 27, 2016

(30) Foreign Application Priority Data

Apr. 24, 2015 (JP) ................. 2015-089781

(51) Int. Cl.
| | |
|---|---|
| *G01R 33/02* | (2006.01) |
| *G01R 33/09* | (2006.01) |
| *G01R 33/00* | (2006.01) |
| *G01R 1/00* | (2006.01) |
| *G11C 5/00* | (2006.01) |
| *G11B 3/00* | (2006.01) |

(52) U.S. Cl.
CPC ....... *G01R 33/093* (2013.01); *G01R 33/0052* (2013.01); *G01R 33/098* (2013.01); *G01R 1/00* (2013.01); *G11B 3/00* (2013.01); *G11C 5/00* (2013.01)

(58) Field of Classification Search
CPC ....... G01R 1/00; H01L 21/00; H01L 2221/00; G11B 3/00; G11B 2209/00; G01D 1/00; G11C 5/00; G11C 2207/00; H01F 1/00
See application file for complete search history.

(56) References Cited

U.S. PATENT DOCUMENTS

| | | | | |
|---|---|---|---|---|
| 5,561,368 A | * | 10/1996 | Dovek ................. | B82Y 25/00 324/252 |
| 6,140,838 A | * | 10/2000 | Johnson ................ | G11C 11/16 326/136 |
| 6,175,296 B1 | * | 1/2001 | Tokunaga ............. | G01D 5/145 324/207.21 |
| 7,248,045 B2 | * | 7/2007 | Shoji ..................... | B82Y 25/00 324/252 |
| 8,410,893 B2 | | 4/2013 | Kawasaki et al. | |
| 8,564,282 B2 | | 10/2013 | Hoshiya et al. | |

(Continued)

*Primary Examiner* — Jermele M Hollington
*Assistant Examiner* — Temilade Rhodes-Vivour
(74) *Attorney, Agent, or Firm* — Hunton & Williams LLP (57) ABSTRACT

A magnetic sensor is provided in which in a case where magnetization amounts of the first ferromagnetic layer and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, in a case of Mst11>Mst12, a relationship of Mst21>Mst22 is satisfied, and in a case of Mst11<Mst12, a relationship of Mst21<Mst22 is satisfied.

7 Claims, 9 Drawing Sheets

(56) References Cited

U.S. PATENT DOCUMENTS

| | | |
|---|---|---|
| 9,207,293 B2 | 12/2015 | Ando et al. |
| 2002/0048128 A1* | 4/2002 | Kamiguchi ............ B82Y 10/00 360/324.1 |
| 2008/0191694 A1* | 8/2008 | Barton ................... G01R 33/09 324/252 |

* cited by examiner

BALANCE

CASE WHERE MAGNETIZATION AMOUNT OF 124a AND
MAGNETIZATION AMOUNT OF 124c ARE BALANCED

FIG. 5B

CASE WHERE MAGNETIZATION
AMOUNT OF 124a IS LARGER THAN
MAGNETIZATION AMOUNT OF 124c

FIG. 5C

CASE WHERE MAGNETIZATION
AMOUNT OF 124a IS SMALLER THAN
MAGNETIZATION AMOUNT OF 124c

FIG. 6

| | 120b | 120d |
|---|---|---|
| MAGNETIZATION AMOUNT | Pin2 > Pin1 | Pin2 > Pin1 |
| ROTATION DIRECTION | + | − |
| ELEMENT RESISTANCE | SMALL | SMALL |

FIG. 7

| | 120b | 120d |
|---|---|---|
| MAGNETIZATION AMOUNT | Pin2 < Pin1 | Pin2 < Pin1 |
| ROTATION DIRECTION | − | + |
| ELEMENT RESISTANCE | LARGE | LARGE |

FIG. 8

| | 120b | 120d |
|---|---|---|
| MAGNETIZATION AMOUNT | Pin2 > Pin1 | Pin2 < Pin1 |
| ROTATION DIRECTION | + | + |
| ELEMENT RESISTANCE | SMALL | LARGE |

FIG. 9

| | 120b | 120d |
|---|---|---|
| MAGNETIZATION AMOUNT | Pin2 < Pin1 | Pin2 > Pin1 |
| ROTATION DIRECTION | – | – |
| ELEMENT RESISTANCE | LARGE | SMALL |

S1 — MAKE MAGNETIC SENSOR ELEMENT 120b
S2 — EVALUATE MAGNETIC SENSOR ELEMENT 120b
S3 — DETERMINE TARGET MAGNETIZATION AMOUNT IN MAGNETIC SENSOR ELEMENT 120d, BASED ON EVALUATION RESULT
S4 — MAKE MAGNETIC SENSOR ELEMENT 120d
S5 — MAKE REMAINING MAGNETIC SENSOR ELEMENTS AND FORM WIRING

FIG. 14

MAGNETIC SENSOR, METHOD OF MANUFACTURING MAGNETIC SENSOR, AND METHOD OF DESIGNING MAGNETIC SENSOR

CLAIM OF PRIORITY

This application contains subject matter related to and claims the benefit of Japanese Patent Application No. 2015-089781 filed on Apr. 24, 2015, the entire contents of which is incorporated herein by reference.

BACKGROUND OF THE DISCLOSURE

1. Field of the Disclosure

The present disclosure relates to a magnetic sensor, a method of manufacturing a magnetic sensor, and a method of designing a magnetic sensor.

2. Description of the Related Art

For example, Japanese Unexamined Patent Application Publication No. 2012-119613 discloses a self-pinning type magnetic detection element in which a Pin layer of a GMR film has a Synthetic-Pin structure and a film thickness of a first magnetic layer is made to be appropriate from the viewpoint of heat resistance and ΔMR, and a magnetic sensor using the magnetic detection element. The magnetic sensor has a laminate structure in which a fixed magnetic layer and a free magnetic layer are laminated with a nonmagnetic material layer interposed therebetween, and the fixed magnetic layer is of a self-pinning type in which a first magnetic layer and a second magnetic layer are laminated with a nonmagnetic intermediate layer interposed therebetween and which is magnetized and fixed in antiparallel, the first magnetic layer is formed of $Fe_xCo_{100-x}$ (where x is 55 at % or more and 65 at % or less) which is a material having a higher coercive force than that in the second magnetic layer, the film thickness of the first magnetic layer is in a range of 14 angstroms or more and 20.5 angstroms or less and is thinner than the second magnetic layer, and the difference between the magnetization amounts of the first magnetic layer and the second magnetic layer is substantially zero.

For example, Japanese Unexamined Patent Application Publication No. 2012-185044 discloses a magnetic sensor which can form a plurality of magnetoresistance effect elements, which are different in sensitivity axis direction from each other and configure a bridge circuit, on the same chip, and is excellent in measurement accuracy. In the magnetic sensor, a plurality of magnetoresistance effect elements are provided on the same chip, thereby configuring a bridge circuit. A fixed magnetic layer of each of the magnetoresistance effect elements is of a self-pinned type, and sensitivity axis directions of the magnetoresistance effect elements configuring a series circuit are antiparallel to each other. On the upper surface of a free magnetic layer of each magnetoresistance effect element, an antiferromagnetic layer is provided which can generate a switched connection bias without performing annealing in a magnetic field, between the antiferromagnetic layer and the free magnetic layer, and align a magnetization direction of each free magnetic layer in a direction orthogonal to the sensitivity axis direction in a state where magnetization variation is possible.

In a self-pinning type magnetic detection element, pinning of a fixed magnetic layer is designed so as to be maintained by a coercive force of a ferromagnetic body through an antiferromagnetic body or an antiparallel coupling layer and stably maintain magnetism without being affected by an external magnetic field at room temperature. However, in a high-temperature environment close to a blocking temperature of the antiferromagnetic body or a Curie temperature of the ferromagnetic body, the magnetic field of the fixed magnetic layer rotates due to an external magnetic field, and if a temperature is lowered in that state, magnetization is fixed in a direction different from the direction intended in a design. The fixing of magnetization in an unintended direction causes an error of a sensor, and therefore, it is necessary to suppress this. Therefore, a balance pin design is adopted which makes magnetization amounts of ferromagnetic body layers which are located above and below an antiparallel coupling layer be the same such that a magnetic field does not rotate even if external magnetic field is applied in a high-temperature environment.

However, the magnetization amount of the ferromagnetic body layer depends on a thickness, and it is not possible to make variation in thickness zero due to tolerance in a process of manufacturing the ferromagnetic body layer. Imbalance occurs in the magnetization amount of the ferromagnetic body layer due to variation in thickness, and thus there is a possibility that the magnetization direction of the fixed magnetic layer may change due to an external magnetic field. According to the study of the inventors, it is found that in a case where tolerance of the thickness of the ferromagnetic body layer is set to be ±0.2 angstroms and a direct-current magnetic field of 600 Oe is applied for 1000 hours at a temperature of 150° C., an angle error of about ±0.15 Deg occurs.

These and other drawbacks exist.

SUMMARY OF THE DISCLOSURE

Embodiments of the present disclosure provide a magnetic sensor in which even if tolerance in a process of manufacturing a ferromagnetic layer exists, an angle error does not occur, and temperature reliability is high.

According to a example embodiment of the disclosure, a magnetic sensor includes: a bridge circuit having a first magnetic sensor element and a second magnetic sensor element, each of the first magnetic sensor element and the second magnetic sensor element having a fixed magnetic layer, a nonmagnetic intermediate layer, and a free magnetic layer, the fixed magnetic layer having a first ferromagnetic layer, a second ferromagnetic layer, and an antiparallel coupling layer which is located between the first ferromagnetic layer and the second ferromagnetic layer, the first ferromagnetic layer and the second ferromagnetic layer being antiferromagnetically coupled together through the antiparallel coupling layer, and a magnetization direction of the fixed magnetic layer in the first magnetic sensor element and a magnetization direction of the fixed magnetic layer in the second magnetic sensor element being different from each other, wherein in a case where magnetization amounts of the first ferromagnetic layer and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, in a case of Mst1>Mst12, a relationship of Mst21>Mst22 is satisfied, and in a case of Mst11<Mst12, a relationship of Mst21<Mst22 is satisfied.

In a case where thicknesses of the first ferromagnetic layer and the second ferromagnetic layer in the second magnetic sensor element are respectively set to be t21 and t22, in a case of Mst11>Mst12, a relationship of t21>t22 may satisfied, and in a case of Mst11<Mst12, a relationship of t21<t22 may be satisfied. In a case where saturation magnetizations of the first ferromagnetic layer and the second ferromagnetic layer in the second magnetic sensor element are respectively set to be Ms21 and Ms22, in a case of Mst11>Mst12, a relationship of Ms21>Ms22 may be satisfied, and in a case of Mst11<Mst12, a relationship of Ms21<Ms22 may be satisfied.

According to an example of the disclosure, a method of manufacturing a magnetic sensor includes a bridge circuit having a first magnetic sensor element and a second magnetic sensor element, each of the first magnetic sensor element and the second magnetic sensor element having a fixed magnetic layer, a nonmagnetic intermediate layer, and a free magnetic layer, the fixed magnetic layer having a first ferromagnetic layer, a second ferromagnetic layer, and an antiparallel coupling layer which is located between the first ferromagnetic layer and the second ferromagnetic layer, the first ferromagnetic layer and the second ferromagnetic layer being antiferromagnetically coupled together through the antiparallel coupling layer, and a magnetization direction of the fixed magnetic layer in the first magnetic sensor element and a magnetization direction of the fixed magnetic layer in the second magnetic sensor element being different from each other, the method including: a step of forming the first magnetic sensor element; a step of measuring a magnitude relationship between magnetization amounts of the first ferromagnetic layer and the second ferromagnetic layer in the first magnetic sensor element; and a step of forming the second magnetic sensor element, wherein in a case where the magnetization amounts of the first ferromagnetic layer and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, in a case where Mst11 being greater than Mst12 is measured in the step of measuring a magnitude relationship, the first ferromagnetic layer and the second ferromagnetic layer of the second magnetic sensor element are formed such that Mst21 is greater than Mst22, in the step of forming the second magnetic sensor element, and in a case where Mst11 being less than Mst12 is measured in the step of measuring a magnitude relationship, the first ferromagnetic layer and the second ferromagnetic layer of the second magnetic sensor element are formed such that Mst21 is less than Mst22, in the step of forming the second magnetic sensor element.

In a case where thicknesses of the first ferromagnetic layer and the second ferromagnetic layer in the second magnetic sensor element are respectively set to be t21 and t22, in a case where Mst11 being greater than Mst12 is measured in the step of measuring a magnitude relationship, the first ferromagnetic layer and the second ferromagnetic layer of the second magnetic sensor element may be formed such that t21 is greater than t22, in the step of forming the second magnetic sensor element, and in a case where Mst11 being less than Mst12 is measured in the step of measuring a magnitude relationship, the first ferromagnetic layer and the second ferromagnetic layer of the second magnetic sensor element may be formed such that t21 is less than t22, in the step of forming the second magnetic sensor element. In a case where saturation magnetizations of the first ferromagnetic layer and the second ferromagnetic layer in the second magnetic sensor element are respectively set to be Ms21 and Ms22, in a case where Mst11 being greater than Mst12 is measured in the step of measuring a magnitude relationship, the first ferromagnetic layer and the second ferromagnetic layer of the second magnetic sensor element may be formed such that Ms21 is greater than Ms22, in the step of forming the second magnetic sensor element, and in a case where Mst11 being less than Mst12 is measured in the step of measuring a magnitude relationship, the first ferromagnetic layer and the second ferromagnetic layer of the second magnetic sensor element may be formed such that Ms21 is less than Ms22, in the step of forming the second magnetic sensor element.

According to an example embodiment of the disclosure, a method of designing a magnetic sensor includes a bridge circuit having a first magnetic sensor element and a second magnetic sensor element, each of the first magnetic sensor element and the second magnetic sensor element having a fixed magnetic layer, a nonmagnetic intermediate layer, and a free magnetic layer, the fixed magnetic layer having a first ferromagnetic layer, a second ferromagnetic layer, and an antiparallel coupling layer which is located between the first ferromagnetic layer and the second ferromagnetic layer, the first ferromagnetic layer and the second ferromagnetic layer being antiferromagnetically coupled together through the antiparallel coupling layer, and a magnetization direction of the fixed magnetic layer in the first magnetic sensor element and a magnetization direction of the fixed magnetic layer in the second magnetic sensor element being different from each other, wherein in a case where magnetization amounts of the first ferromagnetic layer and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, a magnitude relationship between the magnetization amounts of the first ferromagnetic layer and the second ferromagnetic layer in each of the first magnetic sensor element and the second magnetic sensor element is designed so as to satisfy a condition of Mst21>Mst22 in a case of Mst11>Mst12 and satisfy a condition of Mst21<Mst22 in a case of Mst11<Mst12.

In addition, the summary of the disclosure described above is not intended to recite all the necessary features of the present invention. Further, sub-combinations of these feature groups can also be included in the invention.

DETAILED DESCRIPTION OF THE DISCLOSURE

Hereinafter, the present disclosure will be described through an example embodiment. However, the following embodiment does not limit the inventions according to the appended claims. Further, all the combinations of the features described in the example embodiment are not necessarily essential to solving means of the invention.

The following description is intended to convey a thorough understanding of the embodiments described by providing a number of specific embodiments and details involving a magnetic sensor and related methods. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
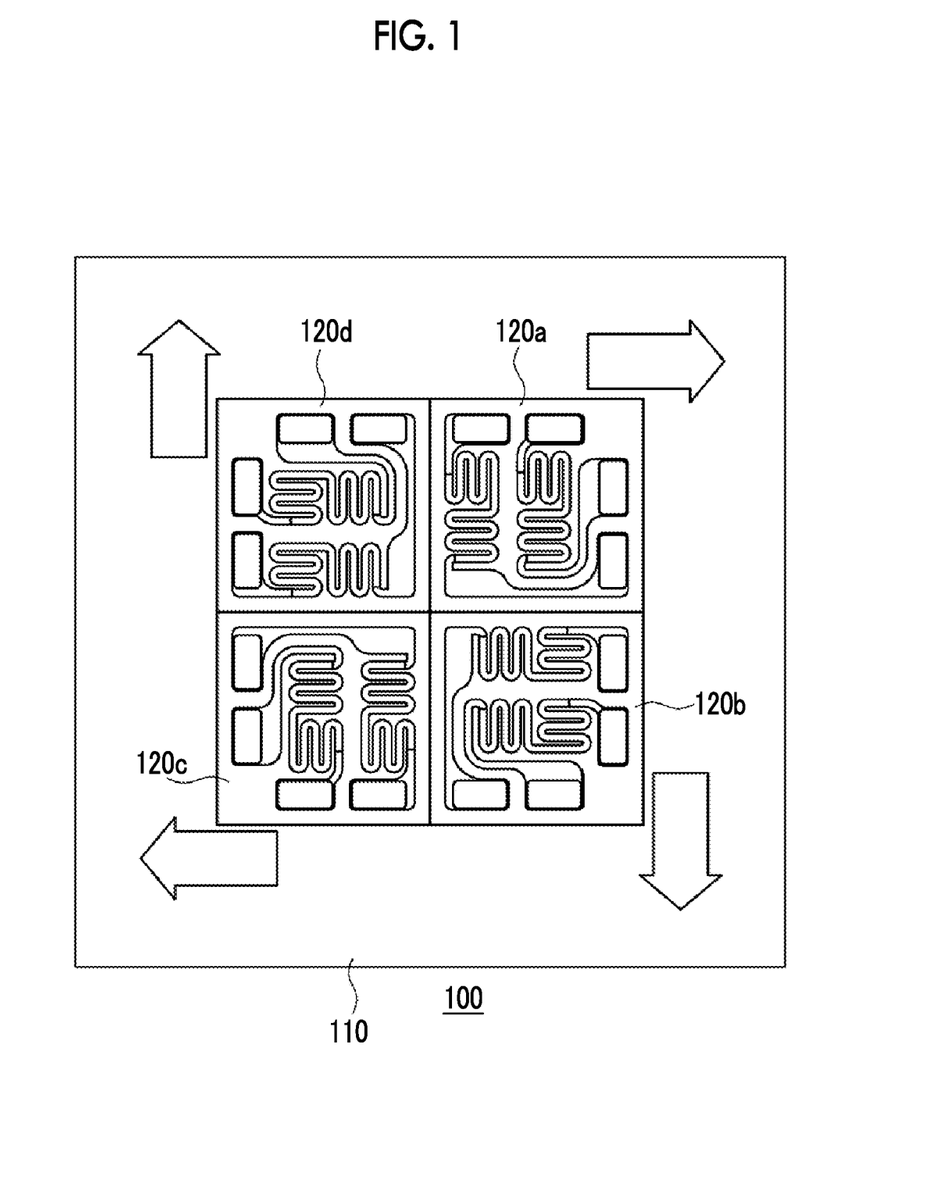
FIG. 1 is a plan view of a magnetic sensor 100.
Figure 2:
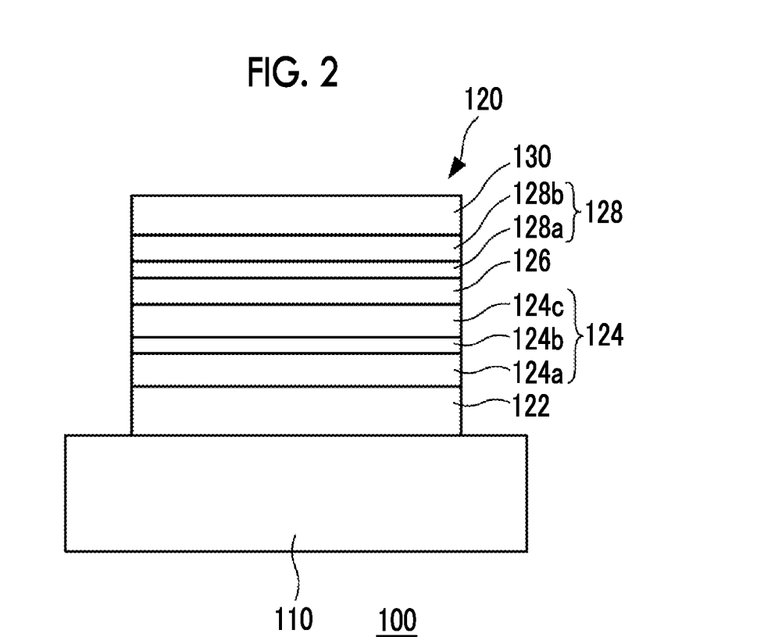
FIG. 2 is a partial sectional view of the magnetic sensor 100.

FIG. 1 is a plan view of a magnetic sensor 100, and FIG. 2 is a partial sectional view of the magnetic sensor 100. The magnetic sensor 100 may have four magnetic sensor elements 120a to 120d on a substrate 110. In addition, in a case where the four magnetic sensor elements 120a to 120d are not described to be distinguished, they shall be referred to simply as a magnetic sensor element 120.

The magnetic sensor element 120 may be a self-pinning type spin valve element such as a giant magnetoresistance effect element (GMR, hereinafterreferred to simply as a "GMR element") or a tunnel magnetoresistance effect element (TMR, hereinafterreferred to simply as a "TMR element"). Here, a case where the magnetic sensor element 120 is the GMR element will be described.

The magnetic sensor element 120 may have the four magnetic sensor elements 120a to 120d in which magnetization directions of fixed magnetic layers are different from each other. In FIG. 1, a white arrow shown in the vicinity of each of the magnetic sensor elements 120a to 120d indicates a magnetization direction in each of the fixed magnetic layers of the magnetic sensor elements 120a to 120d. The respective magnetic sensor elements 120a to 120d may be connected by wiring, whereby a bridge circuit is configured.

As shown in FIG. 2, the magnetic sensor element 120 may have a seed layer 122, a fixed magnetic layer 124, a nonmagnetic intermediate layer 126, a free magnetic layer 128, and a cap layer 130. The fixed magnetic layer 124 may have a first ferromagnetic layer 124a, an antiparallel coupling layer 124b, and a second ferromagnetic layer 124c. The free magnetic layer 128 may have an enhancement layer 128a and a free layer 128b. The fixed magnetic layer 124 may be a self-pinning type fixed magnetic layer. However, the fixed magnetic layer 124 may include an antiferromagnetic layer such as a PtMn layer or IrMn layer. In the free magnetic layer 128, a magnetization direction changes due to an external magnetic field, and a resistance value of the GMR element which is the magnetic sensor element 120 changes according to the angle between the magnetization direction of the fixed magnetic layer 124 and the magnetization direction of the free magnetic layer 128.

Figure 3:
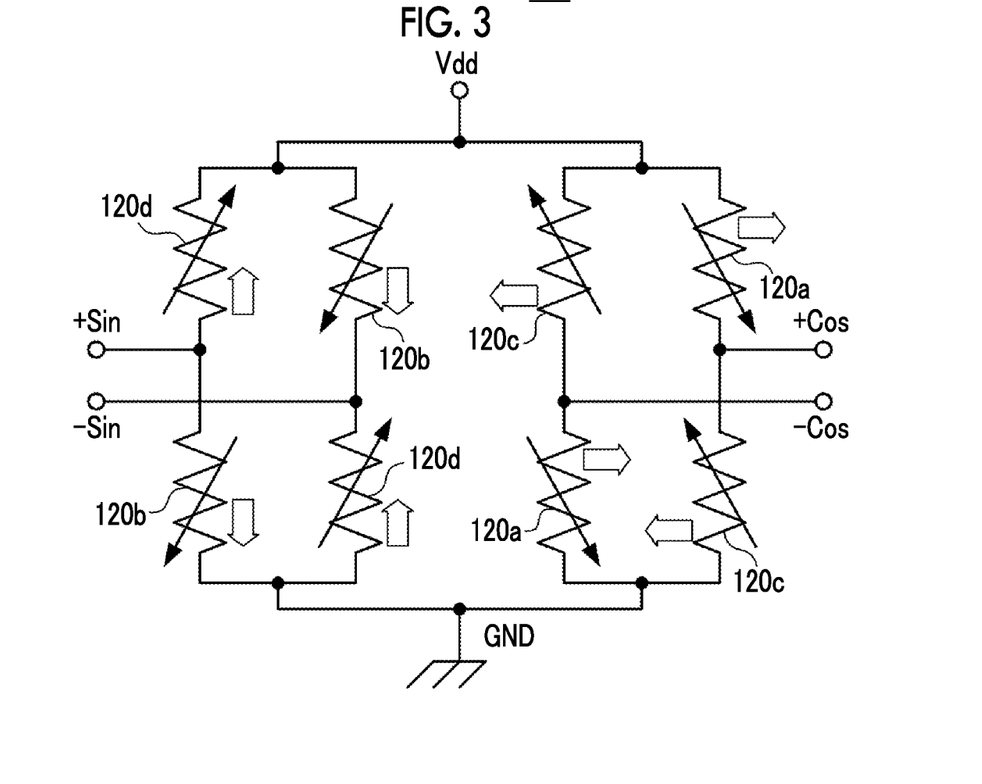
FIG. 3 is a circuit diagram of the magnetic sensor 100.
Figure 4:
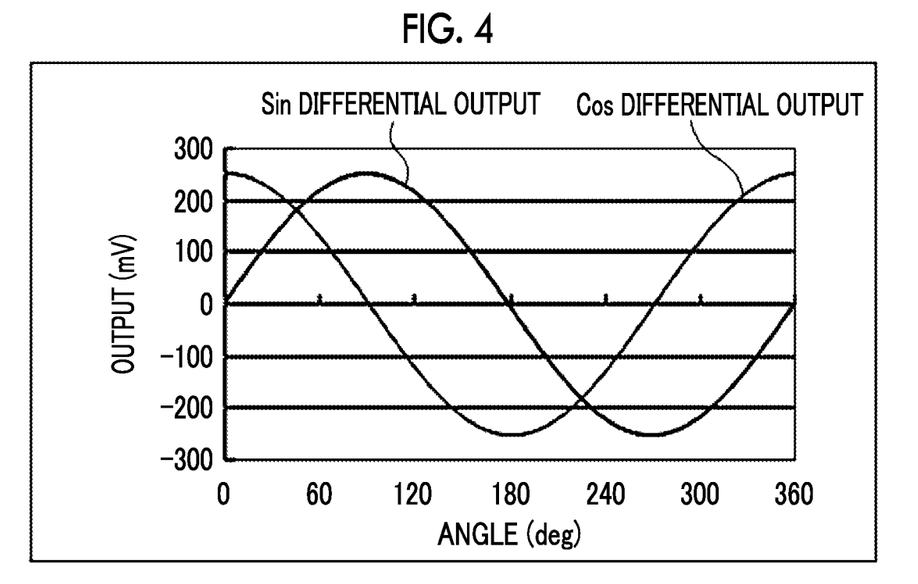
FIG. 4 shows an example of output of the magnetic sensor 100.

FIG. 3 shows a circuit diagram of the magnetic sensor 100. Two bridge circuits may be configured with eight magnetic sensor elements 120a to 120d and 120a to 120d in which the magnetization directions of the fixed magnetic layers 124 may be different from each other, and a Sin differential signal is output from between a +Sin terminal and −Sin terminal, and a Cos differential signal is output from between a +Cos terminal and −Cos terminal. If an arctangent is calculated from Sin differential output and Cos differential output, it is possible to determine a rotation angle of an external magnetic field. FIG. 4 is an example of output of the magnetic sensor 100 and shows the Sin differential output and the Cos differential output of the bridge circuit with respect to a rotation angle in a case where a horizontal rightward direction of the plane of paper in FIG. 1 is set as a reference.

In this way, an external magnetic field can be measured by the magnetic sensor 100. However, since tolerance of a film forming apparatus cannot be made to be zero, variation exists in the thickness or the like of each layer configuring the magnetic sensor element 120. In particular, in a case where variation occurs in the first ferromagnetic layer 124a and the second ferromagnetic layer 124c of the fixed magnetic layer 124, imbalance occurs between the magnetization amounts of both the layers, thereby causing deterioration in heat resistance in a magnetic field.

Figure 5A:
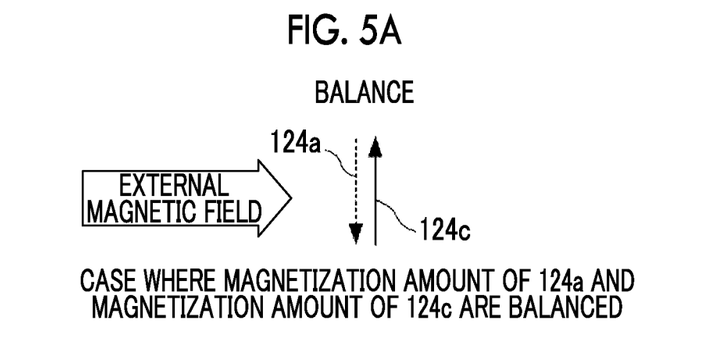
FIGS. 5A to 5C are conceptual diagrams describing heat resistance deterioration in a magnetic field of the magnetic sensor 100.
Figure 5B:
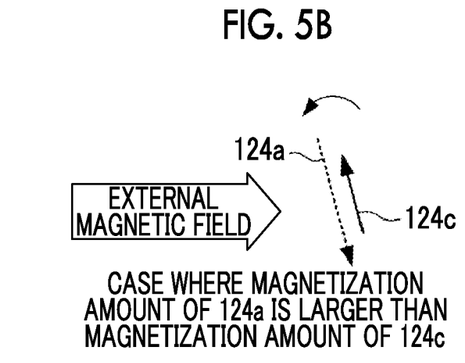
Figure 5C:
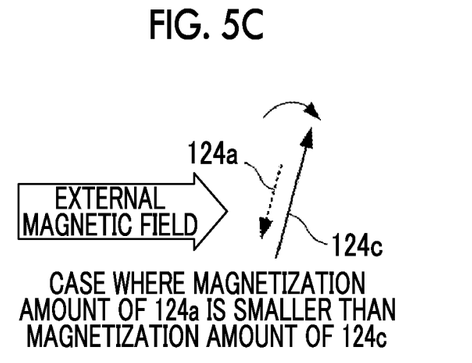

FIGS. 5A to 5C are conceptual diagrams describing heat resistance deterioration in a magnetic field of the magnetic sensor 100. In a case where the magnetization amount (indicated by a dashed arrow in FIGS. 5A to 5C) of the first ferromagnetic layer 124a and the magnetization amount (indicated by a solid arrow in FIGS. 5A to 5C) of the second ferromagnetic layer 124c are balanced (the case of FIG. 5A), even if an external magnetic field is applied in a high temperature state, the rotations of the respective magnetization directions of the first ferromagnetic layer 124a and the second ferromagnetic layer 124c are offset each other, thereby being balanced, and therefore, the rotation of magnetization does not occur. That is, high-temperature reliability in a magnetic field is in a high state. However, in a case where the magnetization amount of the first ferromagnetic layer 124a is larger than the magnetization amount of the second ferromagnetic layer 124c (the case of FIG. 5B), or a case where the magnetization amount of the first ferromagnetic layer 124a is smaller than the magnetization amount of the second ferromagnetic layer 124c (the case of FIG. 5C), if an external magnetic field is applied in a high temperature state, the rotation on the larger magnetization amount side becomes dominant, and thus the magnetization direction of the fixed magnetic layer 124 rotates out of the original design.

The influence of such a rotation of the fixed magnetic layer 124 on the output of the bridge circuit will be described. FIGS. 6 to 9 are diagrams showing output variation in a case where the magnetization direction of the fixed magnetic layer 124 is varied. In each of FIGS. 6 to 9, a diagram on the upper side shows a bridge circuit and the rotation direction of the fixed magnetic layer 124 in each resistance (the magnetic sensor element 120), and a table on the lower side shows the relationship between the magnetization amounts of the first ferromagnetic layer 124*a* and the second ferromagnetic layer 124*c*, the rotation direction of the fixed magnetic layer 124, and a resistance change of the magnetic sensor element 120, with respect to each of the magnetic sensor element 120*b* and the magnetic sensor element 120*d*.

Figure 6:
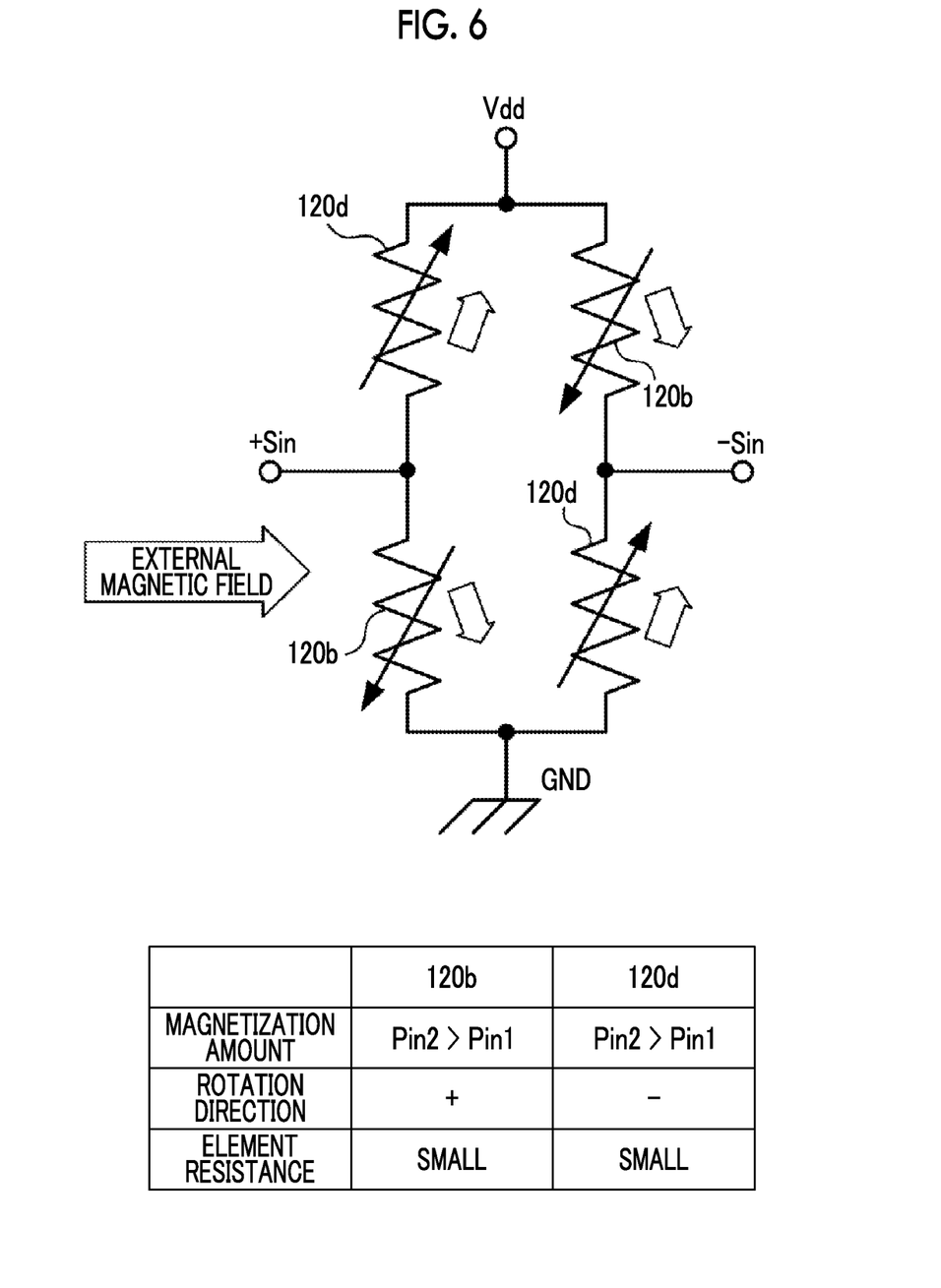
FIG. 6 is a diagram showing output variation in a case where a magnetization direction of a fixed magnetic layer is varied.

In FIG. 6, in both the magnetic sensor element 120*b* and the magnetic sensor element 120*d*, the magnetization amount (indicated by "Pin2" in the table) of the second ferromagnetic layer 124*c* is larger than the magnetization amount (indicated by "Pin1" in the table) of the first ferromagnetic layer 124*a*, and in this case, the rotation directions of the fixed magnetic layers 124 of the magnetic sensor element 120*b* and the magnetic sensor element 120*d* respectively become a counterclockwise direction (indicated by "+" in the table) and a clockwise direction (indicated by "−" in the table). These are directions in which the element resistance becomes small in both the magnetic sensor elements 120*b* and 120*d*, and the output of the bridge circuit does not vary too much by being offset by a change in the element resistance. That is, a problem does not occur.

Figure 7:
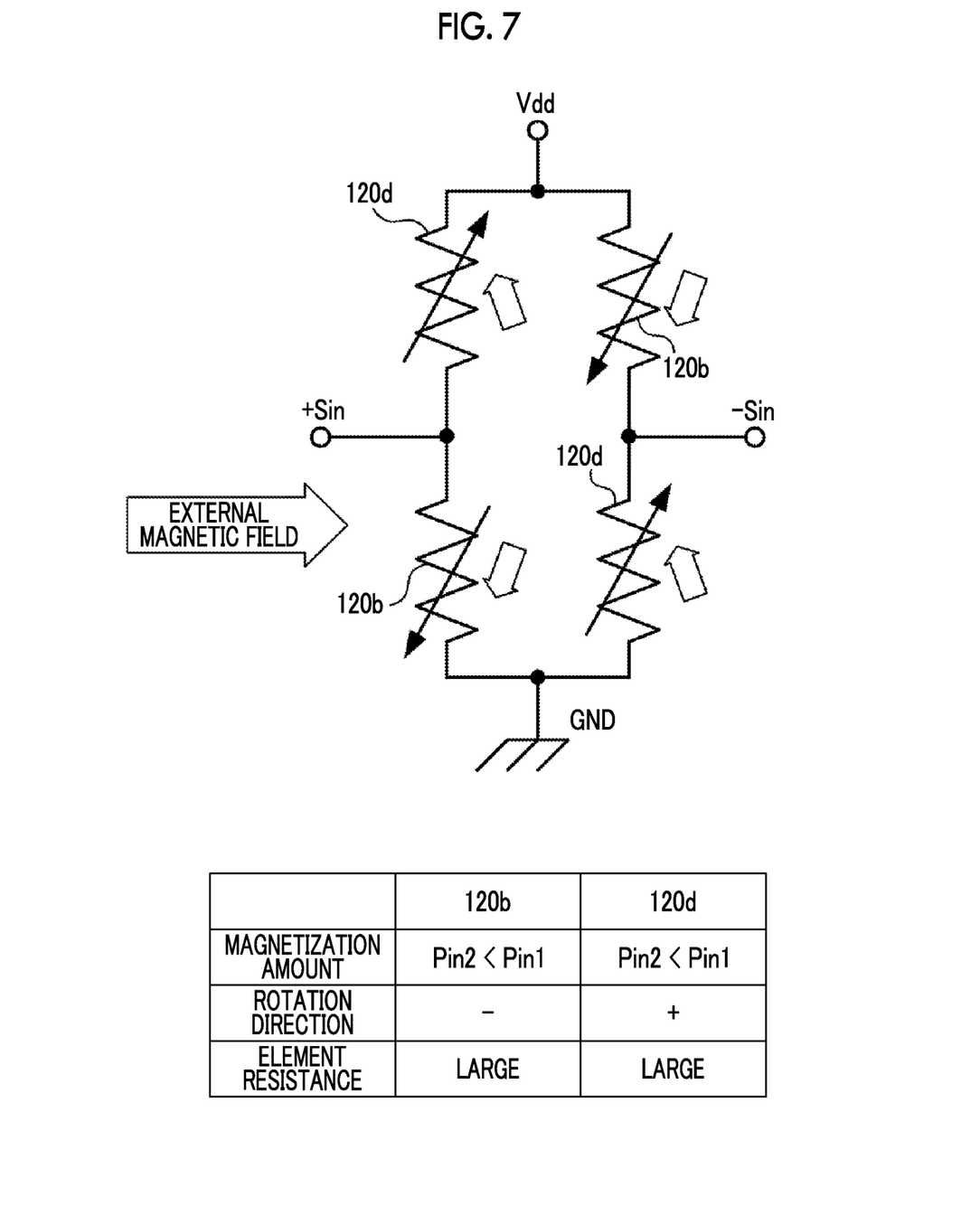
FIG. 7 is a diagram showing output variation in a case where the magnetization direction of the fixed magnetic layer is varied.

In FIG. 7, in both the magnetic sensor element 120*b* and the magnetic sensor element 120*d*, the magnetization amount (indicated by "Pin2" in the table) of the second ferromagnetic layer 124*c* is smaller than the magnetization amount (indicated by "Pin1" in the table) of the first ferromagnetic layer 124*a*, and in this case, the rotation directions of the fixed magnetic layers 124 of the magnetic sensor element 120*b* and the magnetic sensor element 120*d* respectively become the clockwise direction (indicated by "−" in the table) and the counterclockwise direction (indicated by "+" in the table). These are directions in which the element resistance becomes large in both the magnetic sensor elements 120*b* and 120*d*, and the output of the bridge circuit does not vary too much by being offset by a change in the element resistance. That is, a problem does not occur.

Figure 8:
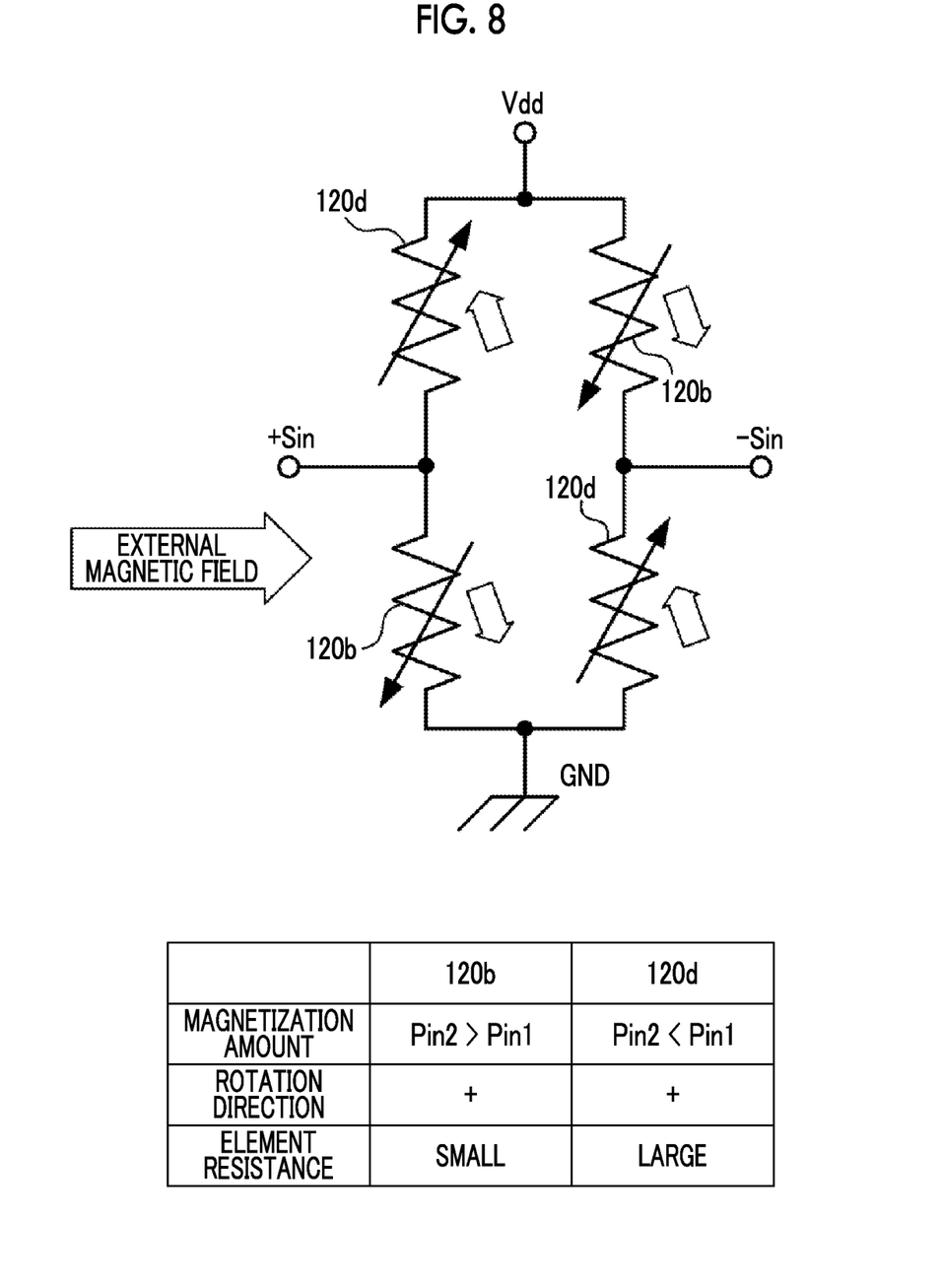
FIG. 8 is a diagram showing output variation in a case where the magnetization direction of the fixed magnetic layer is varied.

FIG. 8 illustrates an example where in the magnetic sensor element 120*b*, the magnetization amount (indicated by "Pin2" in the table) of the second ferromagnetic layer 124*c* is larger than the magnetization amount (indicated by "Pin1" in the table) of the first ferromagnetic layer 124*a*, and in the magnetic sensor element 120*d*, the magnetization amount (indicated by "Pin2" in the table) of the second ferromagnetic layer 124*c* is smaller than the magnetization amount (indicated by "Pin1" in the table) of the first ferromagnetic layer 124*a*, and the rotation direction of the fixed magnetic layer 124 becomes the counterclockwise direction (indicated by "+" in the table) in both the magnetic sensor element 120*b* and the magnetic sensor element 120*d*, and this is a direction in which the element resistance becomes small with respect to the magnetic sensor element 120*b* and becomes large with respect to the magnetic sensor element 120*d*, and the output of the bridge circuit greatly varies, thereby causing a problem.

Figure 9:
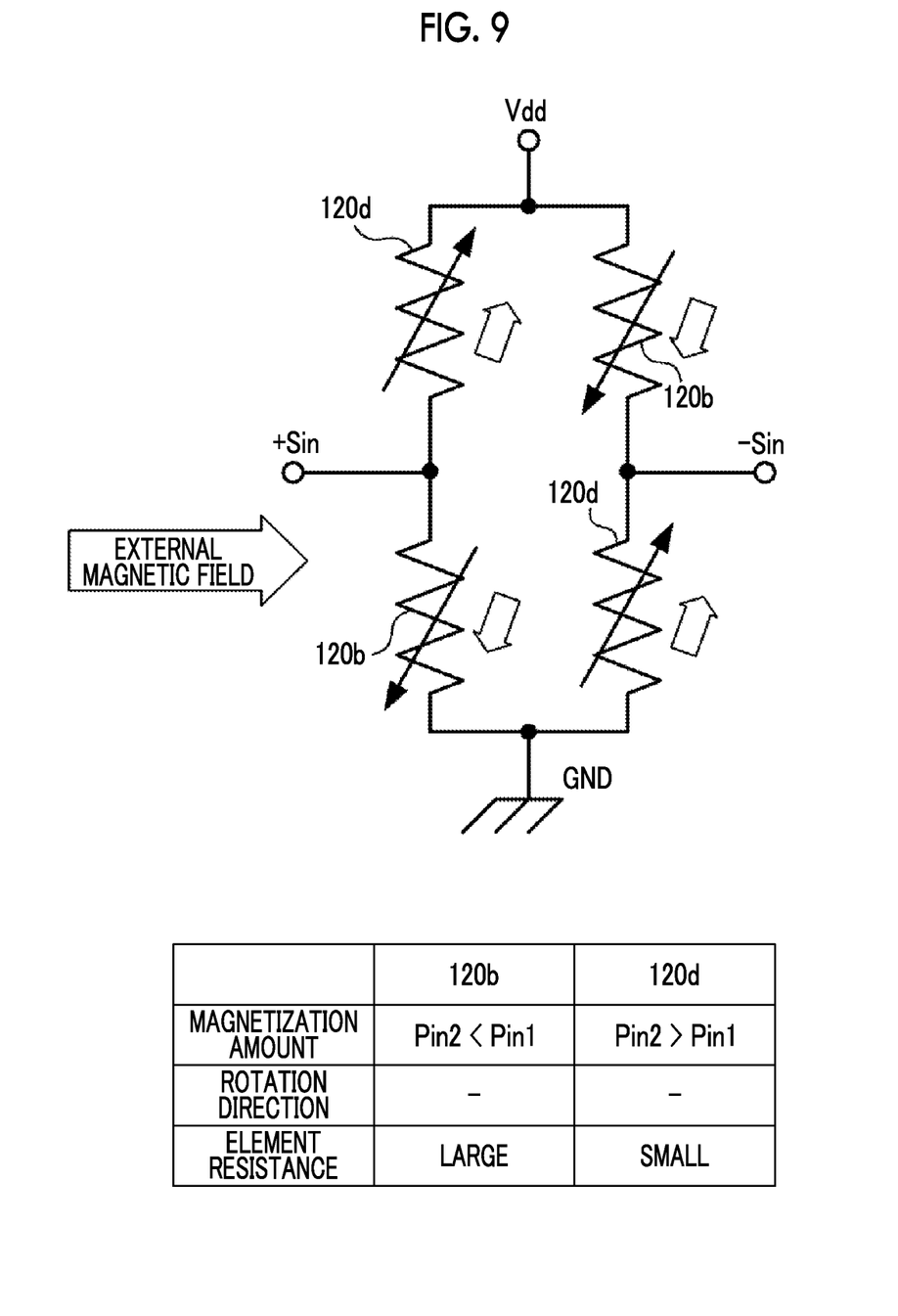
FIG. 9 is a diagram showing output variation in a case where the magnetization direction of the fixed magnetic layer is varied.

FIG. 9 illustrates an example where in the magnetic sensor element 120*b*, the magnetization amount (indicated by "Pin2" in the table) of the second ferromagnetic layer 124*c* is smaller than the magnetization amount (indicated by "Pin1" in the table) of the first ferromagnetic layer 124*a*, and in the magnetic sensor element 120*d*, the magnetization amount (indicated by "Pin2" in the table) of the second ferromagnetic layer 124*c* is larger than the magnetization amount (indicated by "Pin1" in the table) of the first ferromagnetic layer 124*a*, and the rotation direction of the fixed magnetic layer 124 becomes the clockwise direction (indicated by "−" in the table) in both the magnetic sensor element 120*b* and the magnetic sensor element 120*d*, and this is a direction in which the element resistance becomes large with respect to the magnetic sensor element 120*b* and becomes small with respect to the magnetic sensor element 120*d*, and the output of the bridge circuit greatly varies, thereby causing a problem, similar to the case of FIG. 8.

Synthesizing the above, even if there is imbalance in the magnetization amounts of the first ferromagnetic layer 124*a* and the second ferromagnetic layer 124*c*, it is possible to suppress output variation of the bridge circuit, and to that end, it can be said that it is necessary to satisfy the following conditions. That is, in an example where the magnetization amounts of the first ferromagnetic layer 124*a* and the second ferromagnetic layer 124*c* of the magnetic sensor element 120*b* (a first magnetic sensor element) are respectively set to be Mst11 and Mst12 and the magnetization amounts of the first ferromagnetic layer 124*a* and the second ferromagnetic layer 124*c* of the magnetic sensor element 120*d* (a second magnetic sensor element) are respectively set to be Mst21 and Mst22, it is favorable if in a case of Mst11>Mst12, a relationship of Mst21>Mst22 is satisfied and in a case of Mst11<Mst12, a relationship of Mst21<Mst22 is satisfied.

Since the magnetization amount is multiplication of saturation magnetization Ms and a thickness t, the above conditions can also be said as follows. That is, in a case where the thicknesses of the first ferromagnetic layer 124*a* and the second ferromagnetic layer 124*c* of the magnetic sensor element 120*d* (the second magnetic sensor element) are respectively set to be t21 and t22, in the case of Mst11>Mst12, a relationship of t21>t22 may be satisfied, and in the case of Mst11<Mst12, a relationship of t21<t22 may be satisfied. Also, in an example where the saturation magnetization of the first ferromagnetic layer 124*a* and the second ferromagnetic layer 124*c* of the magnetic sensor element 120*d* (the second magnetic sensor element) are respectively set to be Ms21 and Ms22, in the case of Mst11>Mst12, a relationship of Ms21>Ms22 may be satisfied, and in the case of Mst11<Mst12, a relationship of Ms21<Ms22 may be satisfied.

Figure 10:
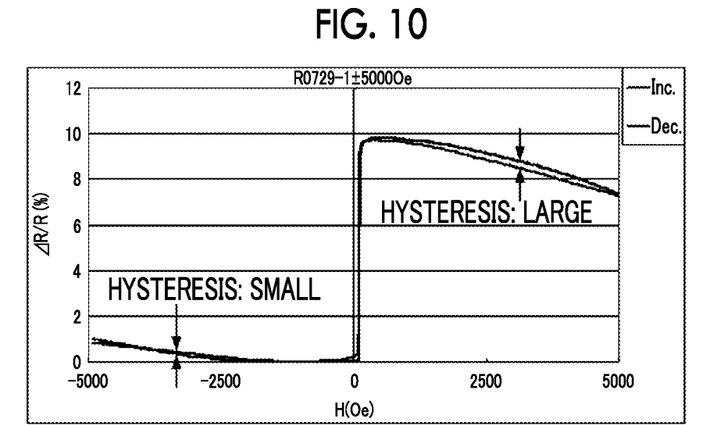
FIG. 10 is a diagram showing a magnetic field-resistance curve for evaluating a balance between a first ferromagnetic layer and a second ferromagnetic layer.
Figure 11:
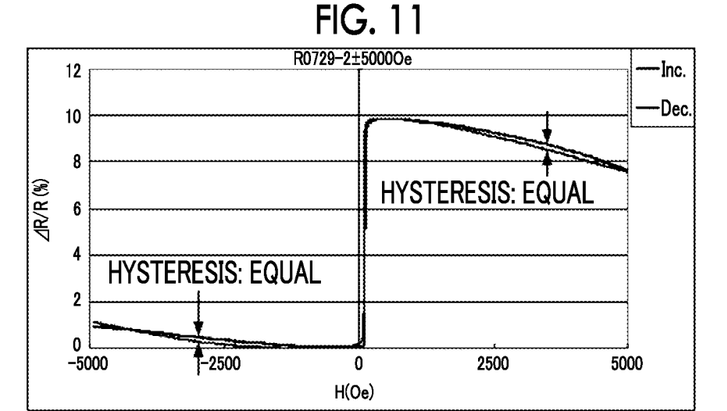
FIG. 11 is a diagram showing a magnetic field-resistance curve for evaluating a balance between the first ferromagnetic layer and the second ferromagnetic layer.
Figure 12:
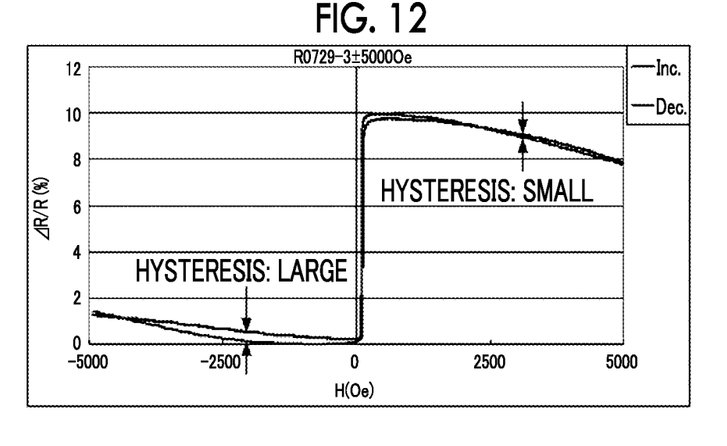
FIG. 12 is a diagram showing a magnetic field-resistance curve for evaluating a balance between the first ferromagnetic layer and the second ferromagnetic layer.

Further, a magnitude relationship between the magnetization amounts of the first ferromagnetic layer 124*a* and the second ferromagnetic layer 124*c* can be determined by measuring a magnetic field-resistance curve of the magnetic sensor element 120. FIGS. 10 to 12 are diagrams showing a magnetic field-resistance curve for evaluating a balance between the first ferromagnetic layer and the second ferromagnetic layer. In FIG. 10, hysteresis is observed at the graph upper right (an area where a magnetic field is a positive direction), and in this case, it can be evaluated that the magnetization amount is larger in the second ferromagnetic layer 124*c* than the first ferromagnetic layer 124*a*. In FIG. 11, hysteresis is balanced at positive and negative areas of a magnetic field, and it can be evaluated that the magnetization amounts of the first ferromagnetic layer 124*a* and the second ferromagnetic layer 124*c* are balanced. In FIG. 12, hysteresis is observed at the graph lower left (an area where a magnetic field is a negative direction), and in this case, it can be evaluated that the magnetization amount is larger in the first ferromagnetic layer 124*a* than the second ferromagnetic layer 124*c*.

Figure 13:
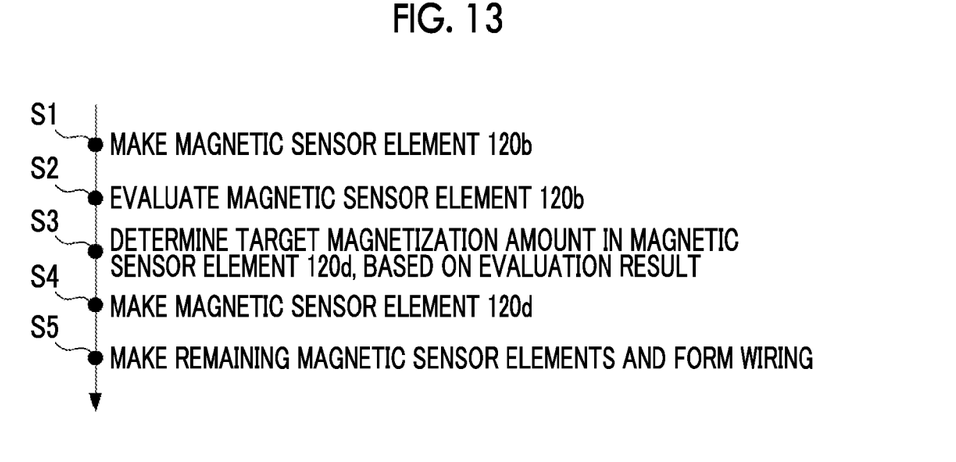
FIG. 13 is a flowchart showing an example of a method of manufacturing the magnetic sensor 100.

FIG. 13 is a flowchart showing an example of a method of manufacturing the magnetic sensor 100. The magnetic sensor elements 120*a* to 120*d* of the magnetic sensor 100 may be sequentially formed by changing a magnetic field which is applied. The seed layer 122, the fixed magnetic layer 124, the nonmagnetic intermediate layer 126, the free magnetic layer 128, and the cap layer 130 which configure each magnetic sensor element can be formed by, for example, a sputtering method, and the formed laminated film can be patterned by a method of patterning and then etching a mask, or a method of lifting off a mask patterned in advance.

Here, an example in which the magnitude relationship between the magnetization amounts of the first ferromagnetic layer 124a and the second ferromagnetic layer 124c in the magnetic sensor element 120b is evaluated and a magnetization amount is adjusted in a film forming process of the first ferromagnetic layer 124a and the second ferromagnetic layer 124c of the magnetic sensor element 120d will be described. That is, the magnetic sensor element 120b is made by the method described above (S1), and the magnitude relationship between the magnetization amounts of the first ferromagnetic layer 124a and the second ferromagnetic layer 124c of the magnetic sensor element 120b is evaluated by, for example, the magnetic field-resistance curve described above (S2). The magnetization amounts of the first ferromagnetic layer 124a and the second ferromagnetic layer 124c of the magnetic sensor element 120d are determined based on the evaluation result so as to satisfy the conditions described above (S3). The magnetization amount can be adjusted by changing a thickness or saturation magnetization. The magnetic sensor element 120d is made under the conditions determined in S3 (S4), and the remaining magnetic sensor elements 120 are made and wiring is formed (S5). In this way, the magnetic sensor 100 can be manufactured.

According to the magnetic sensor 100 described above, it is possible to provide a magnetic sensor in which even if tolerance in a manufacturing process exists, an angle error does not occur, and temperature reliability is high.

Figure 14:
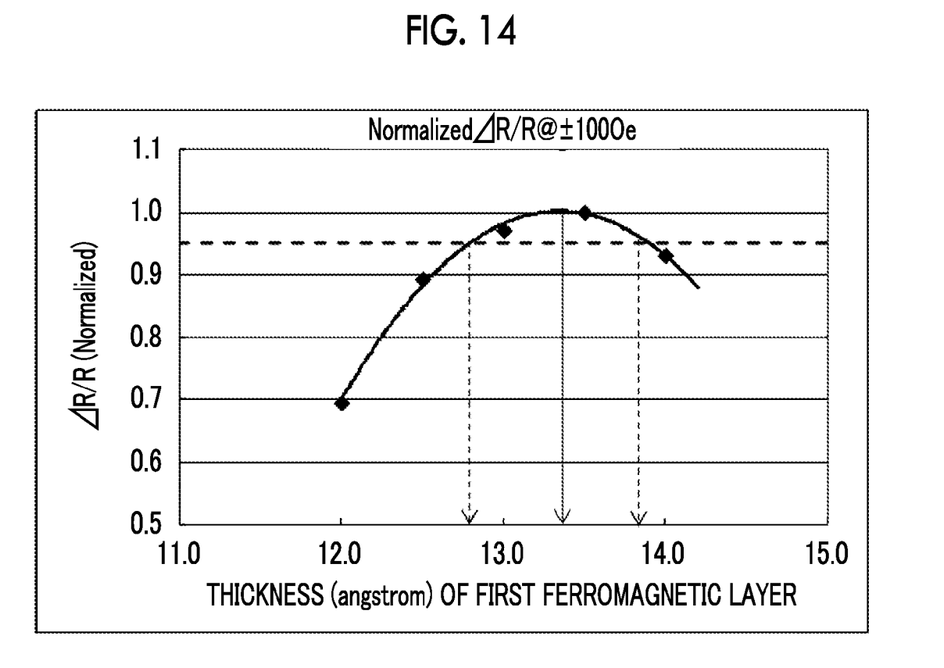
FIG. 14 is a diagram showing a resistance change in a case where the thickness of the first ferromagnetic layer varies.

FIG. 14 is a diagram showing a resistance change in a case where the thickness of the first ferromagnetic layer 124a varies. The thickness of the second ferromagnetic layer 124c is set to be 16 angstroms. If the thickness of the first ferromagnetic layer 124a in which a rate of change in resistance becomes the maximum is 13.3 angstroms and an attempt to suppress deterioration of a rate of change in resistance within 5% is made, it is appropriate that variation in the thickness of the first ferromagnetic layer 124a is set to be about ±0.5 angstroms. Accordingly, in a case of trying to realize a balance with the thickness of the first ferromagnetic layer 124a in the determination of the magnetization amount of S3 described above, it can be said that it is preferable to perform adjustment within a range of ±0.5 angstroms from a design thickness.

Heretofore, the present disclosure has described an example embodiment. However, the technical scope of the present invention is not limited to the scope described in the above-described embodiment. It will be apparent to those skilled in the art that it is possible to apply various modifications or improvements to the above-described embodiment. It will be apparent from the description of the appended claims that forms with such modifications or improvements applied thereto can also be included in the technical scope of the present invention.

For example, in the above-described embodiment, the magnetic sensor 100 and the method of manufacturing the magnetic sensor 100 have been described. However, it is also possible to grasp the invention as a method of designing the magnetic sensor 100.

It should be understood by those skilled in the art that various modifications, combinations, sub-combinations and alterations may occur depending on design requirements and other factors insofar as they are within the scope of the appended claims of the equivalents thereof.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A magnetic sensor comprising:
    a bridge circuit having a first magnetic sensor element and a second magnetic sensor element,
    each of the first magnetic sensor element and the second magnetic sensor element having a fixed magnetic layer, a nonmagnetic intermediate layer, and a free magnetic layer,
    the fixed magnetic layer having a first ferromagnetic layer, a second ferromagnetic layer, and an antiparallel coupling layer which is located between the first ferromagnetic layer and the second ferromagnetic layer,
    the first ferromagnetic layer and the second ferromagnetic layer being antiferromagnetically coupled together through the antiparallel coupling layer, and
    a magnetization direction of the fixed magnetic layer in the first magnetic sensor element and a magnetization direction of the fixed magnetic layer in the second magnetic sensor element being different from each other,
    the first ferromagnetic layer having a magnetization amount and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22,
    in a case of Mst11>Mst12, a relationship of Mst21>Mst22 is satisfied, and in a case of Mst11<Mst12, a relationship of Mst21<Mst22 is satisfied.

2. The magnetic sensor according to claim 1, wherein in a case where thicknesses of the first ferromagnetic layer and the second ferromagnetic layer in the second magnetic sensor element are respectively set to be t21 and t22,
    in a case of Mst11>Mst12, a relationship of t21>t22 is satisfied, and in a case of Mst11<Mst12, a relationship of t21<t22 is satisfied.

3. The magnetic sensor according to claim 1, wherein in a case where saturation magnetizations of the first ferromagnetic layer and the second ferromagnetic layer in the second magnetic sensor element are respectively set to be Ms21 and Ms22,
    in a case of Mst11>Mst12, a relationship of Ms21>Ms22 is satisfied, and in a case of Mst11<Mst12, a relationship of Ms21<Ms22 is satisfied.

4. A method of manufacturing a magnetic sensor including a bridge circuit having a first magnetic sensor element and a second magnetic sensor element, each of the first magnetic sensor element and the second magnetic sensor element having a fixed magnetic layer, a nonmagnetic intermediate layer, and a free magnetic layer, the fixed magnetic layer having a first ferromagnetic layer, a second ferromagnetic layer, and an antiparallel coupling layer which is located between the first ferromagnetic layer and the second ferromagnetic layer, the first ferromagnetic layer and the second ferromagnetic layer being antiferromagnetically coupled together through the antiparallel coupling layer, and a magnetization direction of the fixed magnetic layer in the first magnetic sensor element and a magnetization direction of the fixed magnetic layer in the second magnetic sensor element being different from each other, the method comprising:

forming the first magnetic sensor element;

measuring a magnitude relationship between magnetization amounts of the first ferromagnetic layer and the second ferromagnetic layer in the first magnetic sensor element; and forming the second magnetic sensor element, the first ferromagnetic layer having a magnetization amount and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, in a case where Mst11 being greater than Mst12 is measured in the step of measuring a magnitude relationship, the first ferromagnetic layer and the second ferromagnetic layer of the second magnetic sensor element are formed such that Mst21 is greater than Mst22, in the step of forming the second magnetic sensor element, and in a case where Mst11 being less than Mst12 is measured in the step of measuring a magnitude relationship, the first ferromagnetic layer and the second ferromagnetic layer of the second magnetic sensor element are formed such that Mst21 is less than Mst22, in the step of forming the second magnetic sensor element.

5. The method of manufacturing a magnetic sensor according to claim 4, wherein in a case where thicknesses of the first ferromagnetic layer and the second ferromagnetic layer in the second magnetic sensor element are respectively set to be t21 and t22, in a case where Mst11 being greater than Mst12 is measured in the step of measuring a magnitude relationship, the first ferromagnetic layer and the second ferromagnetic layer of the second magnetic sensor element are formed such that t21 is greater than t22, in forming the second magnetic sensor element, and in a case where Mst11 being less than Mst12 is measured in the step of measuring a magnitude relationship, the first ferromagnetic layer and the second ferromagnetic layer of the second magnetic sensor element are formed such that t21 is less than t22, in forming the second magnetic sensor element.

6. The method of manufacturing a magnetic sensor according to claim 4, wherein in a case where saturation magnetizations of the first ferromagnetic layer and the second ferromagnetic layer in the second magnetic sensor element are respectively set to be Ms21 and Ms22, in a case where Mst11 being greater than Mst12 is measured in the step of measuring a magnitude relationship, the first ferromagnetic layer and the second ferromagnetic layer of the second magnetic sensor element are formed such that Ms21 is greater than Ms22, in forming the second magnetic sensor element, and in a case where Mst11 being less than Mst12 is measured in the step of measuring a magnitude relationship, the first ferromagnetic layer and the second ferromagnetic layer of the second magnetic sensor element are formed such that Ms21 is less than Ms22, in forming the second magnetic sensor element.

7. A method of designing a magnetic sensor including a bridge circuit having a first magnetic sensor element and a second magnetic sensor element, each of the first magnetic sensor element and the second magnetic sensor element having a fixed magnetic layer, a nonmagnetic intermediate layer, and a free magnetic layer, the fixed magnetic layer having a first ferromagnetic layer, a second ferromagnetic layer, and an antiparallel coupling layer which is located between the first ferromagnetic layer and the second ferromagnetic layer, the first ferromagnetic layer and the second ferromagnetic layer being antiferromagnetically coupled together through the antiparallel coupling layer, and a magnetization direction of the fixed magnetic layer in the first magnetic sensor element and a magnetization direction of the fixed magnetic layer in the second magnetic sensor element being different from each other, the first ferromagnetic layer having a magnetization amount and the second ferromagnetic layer in the first magnetic sensor element are respectively set to be Mst11 and Mst12 and magnetization amounts of the first ferromagnetic layer and the second ferromagnetic layer in the second magnetic sensor element are respectively set to be Mst21 and Mst22, a magnitude relationship between the magnetization amounts of the first ferromagnetic layer and the second ferromagnetic layer in each of the first magnetic sensor element and the second magnetic sensor element is designed so as to satisfy a condition of Mst21>Mst22 in a case of Mst11>Mst12 and satisfy a condition of Mst21<Mst22 in a case of Mst11<Mst12.

* * * * *